United States Patent [19]

Schulman

[11] Patent Number: 4,780,749
[45] Date of Patent: Oct. 25, 1988

[54] DOUBLE BARRIER TUNNEL DIODE HAVING MODIFIED INJECTION LAYER

[75] Inventor: Joel N. Schulman, Agoura, Calif.

[73] Assignee: Hughes Aircraft Company, Los Angeles, Calif.

[21] Appl. No.: 880,850

[22] Filed: Jul. 1, 1986

[51] Int. Cl.[4] .......................................... H01L 29/88
[52] U.S. Cl. ...................................... 357/12; 357/16; 357/58; 357/4
[58] Field of Search .................... 357/12, 45 L, 16, 58

[56] References Cited

U.S. PATENT DOCUMENTS

| 4,286,275 | 8/1981 | Heiblum | 357/12 |
| 4,439,782 | 3/1984 | Holonyak, Jr. | 357/17 |

FOREIGN PATENT DOCUMENTS

| 0081007 | 6/1983 | European Pat. Off. | 357/12 |
| 59-67676 | 4/1984 | Japan | 357/4 |
| 59-90978 | 5/1984 | Japan | 357/4 |
| 61-84872 | 4/1985 | Japan | 357/4 |

OTHER PUBLICATIONS

Shen et al, "Photoreflectance Study of GaAs/AlAs Superlattices:Fit to Electromodulation Theory," 48 *Appl. Phys. Lett.*, 653–655, (Mar. 1986).
Summers et al, "Variably Spaced Superlattice Energy Filter, A New Device Design Concept for High-Energy Electron Injection," *Appl. Phys. Lett.*, 48(12), 24 Mar. 86, 806–808.
Kaede et al, "High-Speed GaAs/AlGaAs Photoconductive Detector Using a P-Modulation-Doped Multiquantum Well Structure," *Appl. Phys. Lett.*, 48(16), 21 Apr. 86, 1096–1097.
Ray et al, "Resonant Tunneling Transport at 300K in GaAs-AlGaAs Quantum Wells Grown by Metalorganic Chemical Vapor Deposition, *Appl. Phys. Lett.*, 48(24), 16 Jun. 1986, pp. 1666–1668.
Yokoyama et al, "A New Functional, Resonant-Tunneling Hot Electron Transistor (RHET)," *Jap. Jor. of Appl. Phys.*, vol. 24, No. 11, Nov. 1985, L853–54.
Neikirk et al, "Quantum-Well Devices will Challenge HEMTs," *Microwaves & RF*, Jul. 1986, pp. 93–97.
Sollner et al, "Resonant Tunneling through Quantum Wells at Frequencies up to 2.5 THz," *Appl. Phys. Lett.*, 43(6), 15 Sep. 1983, pp. 588–589.

*Primary Examiner*—Martin H. Edlow
*Assistant Examiner*—William A. Mintel
*Attorney, Agent, or Firm*—Terje Gudmestad; Paul M. Coble; A. W. Karambelas

[57] ABSTRACT

A double barrier tunnel diode, wherein a central quantum well is disposed between a pair of barrier layers to form a quantum barrier, the barrier layers having a composition such that a resonance energy level is created in the quantum well layer, and having a thickness sufficiently small that electrons can tunnel through the quantum barrier under an applied voltage. The quantum well and barrier layers are disposed between two electron injection layers having compositions selected so that the conduction band minimum energy for electrons in the injection layers is about that of, but less than, the resonance energy level of the quantum well. Electrons pass through the quantum barrier by tunneling, upon application of a small voltage across the double barrier tunnel diode sufficient to raise electrons near the conduction band minimum energy of the injection layer to the resonance energy level of the quantum well. The internal voltage necessary for tunneling is reduced, as compared with conventional double barrier tunnel diodes. A higher tunneling current and a higher peak-to-valley current ratio over the negative resistance range are obtained, and the DC operating point voltage is reduced.

11 Claims, 1 Drawing Sheet

DOUBLE BARRIER TUNNEL DIODE HAVING MODIFIED INJECTION LAYER

BACKGROUND OF THE INVENTION

This invention relates to semiconductor diodes, and, more particularly, to a modified double barrier tunnel diode.

A diode is a semiconductor device having a nonlinear voltage-current relation. Diodes are among the most important of solid-state devices, and are used widely in many electronic applications. The tunnel diode is one variety of diode, having the unusual characteristic of negative resistance. As the term is used, negative resistance is a voltage-current behavior wherein, over certain voltage ranges, increasing the voltage applied across the diode leads to decreased current carried through the diode. By contrast, in most devices an increasing applied voltage results in increasing current. Tunnel diodes have a number of applications, including high frequency oscillator circuits and high frequency electronic switches.

One type of tunnel diode is the double barrier tunnel diode. In an embodiment of particular interest, a double barrier tunnel diode includes a gallium arsenide quantum well having a thin barrier layer of aluminum gallium arsenide epitaxially joined on each side thereof. This structure, herein termed a quantum barrier, in turn lies between two injection layers of gallium arsenide. The quantum barrier creates an energy barrier to the flow of electrons that can be overcome by electrons only under certain conditions, and which results in the negative resistance characteristic of interest over a range of applied voltage. Electrons are injected into the quantum barrier from one of the injection layers under an internal voltage, produced by an applied external voltage. The internal voltage increases the energy of the injected electrons to satisfy the resonant tunneling condition of the quantum barrier. Under the proper conditions of voltage sufficient to satisfy the resonance condition, the electrons tunnel through the quantum barrier.

Not all of the conduction band electrons in the injection layer are able to pass through the quantum barrier, and the probability that an electron passes through as a function of electron energy is termed the transmission coefficient. Such double barrier tunnel diodes exhibit the negative resistance characteristic, since increasing voltages above the voltage required for satisfying the resonance condition reduce the transmission coefficient and thence the current flowing through the diode.

Conventional double barrier tunnel diodes have two problems that limit their usefulness in certain devices. First, a fairly high internal voltage, and consequently a high applied external voltage, is required to induce tunneling through the quantum barrier. (As will be discussed more completely below, the external or contact voltage is the voltage applied between the device contacts, while the internal voltage is that actually experienced across the quantum barrier.) Calculations and experiments have shown that the high internal voltage required for tunneling of the electrons creates an asymmetry in the potential profile that significantly reduces the transmission coefficient. That is, while the conventional double barrier tunnel diode does achieve the desired negative resistance effect, its efficiency in passing electrons at the resonance energy is significantly reduced from the theoretical maximum for a zero applied voltage. The high internal voltage required also implies a high DC operating point voltage to bias the device to its negative resistance operating range, when the double barrier tunnel diode is used as a component of an electronic circuit. The higher DC operating point voltage increases the power consumption of the device and also impairs the high frequency performance of the circuit.

Second, an important property used to describe the operation of the double barrier tunnel diode is the "peak-to-valley" ratio of the maximum current at the beginning of the negative resistance region to the minimum current at the end of the negative resistance region. The greater this ratio, the greater the operating range over which the device may be used in its negative resistance mode of operation, and the greater can be the output power of the device. The applied voltage required to produce tunneling in conventional double barrier tunnel diodes lowers this ratio, thereby decreasing the operating range of the diode.

For these reasons, the conventional double barrier tunnel diode is limited in some planned applications by the high internal voltage required, the high power consumption, and the low peak-to-valley ratio. There is a need for an improved device that achieves the negative resistance characteristic of the conventional double barrier tunnel diode, but does not have the previously discussed problems. The present invention fulfills this need, and further provides related advantages.

SUMMARY OF THE INVENTION

The present invention is embodied in a modified double barrier tunnel diode wherein the internal voltage required to induce tunneling of electrons is significantly reduced as compared with that of conventional double barrier tunnel diodes. The peak-to-valley current ratio is increased, and this increases the operating range of the device and increases its power output. Additionally, the DC operating point voltage of the diode is reduced, improving its high frequency performance and lowering its power consumption.

In accordance with the invention, a double barrier tunnel diode comprises a quantum well having at least one layer of a semiconductor material, the quantum well having a resonance energy for electrons; a pair of electron injection layers on either side of the quantum well, the electron injection layers having compositions such that the conduction band minimum energy for electrons in the injection layers is about that of, but less than, the resonance energy of the quantum well; and a barrier layer between each of the electron injection layers and the quantum well, the barrier layers having a composition such that the conduction band minimum energy for electrons in the barrier layers is greater than the resonance energy of the quantum well, and having a thickness sufficiently small to permit electrons to tunnel through the barrier layers and the quantum well.

Alternatively stated, a double barrier tunnel diode comprises a quantum barrier, including a quantum well having at least one layer of a semiconductor material and a resonance energy for electrons, and a barrier layer on each side of the quantum well, the barrier layers having a composition such that the conduction band minimum energy for electrons in the barrier layers is greater than the resonance energy of the quantum well, and having a thickness sufficiently small to permit electrons to tunnel through the quantum barrier; and a pair of electron injection layers on either side of the quantum barrier, the electron injection layers having a composition such that the conduction band minimum energy for electrons in the injection layers is about that of, but less than, the resonance energy of the quantum well.

The composition of the injection layers is modified so as to raise their electron conduction band minimum energy to a value nearly as great as that of the resonance energy of the quantum well, but slightly below the resonance energy. As a result, the internal voltage required to satisfy the resonance condition to permit tunneling is significantly reduced to a small value. The reduced value of the required internal voltage is determined by the closeness of the conduction band minimum to the resonance energy. The composition should not be modified so that the conduction band minimum energy of the injection layer is equal to or greater than that of the resonance energy of the quantum well, since then tunneling through the quantum barrier would not occur, and the desired negative resistance operating range could not be achieved. Preferably, the conduction band minimum energy of the injection layers is below the resonance energy of the quantum well by an amount such that the Fermi level of the injection layers is at about the same energy as the resonance energy of the quantum well, to maximize the diode current at resonance.

Reduction of the required internal voltage to satisfy the resonance condition yields important advantages in the properties of the improved double barrier tunnel diode. The energy bands are skewed and tilted less by the internal voltage than in conventional double barrier tunnel diodes, resulting in an increased transmission coefficient of electrons through the quantum barrier structure and higher currents. The peak-to-valley current ratio is increased, resulting in a greater operating range of the device. Because of the lower internal voltage required, the externally applied DC operating point voltage of the diode is also reduced, reducing its power consumption and improving its high frequency performance.

The presently preferred embodiment of the invention is found in a gallium arsenide based double barrier tunnel diode. In accordance with this embodiment, the quantum well is a layer of gallium arsenide, the injection layers are aluminum gallium arsenide, and the barrier layers are aluminum gallium arsenide of an aluminum content greater than that of the injection layers.

More specifically, the preferred double barrier tunnel diode comprises a gallium arsenide quantum well having a resonance energy level for electrons; a pair of aluminum gallium arsenide electron injection layers on either side of the quantum well, each of the injection layers having a composition of $Al_xGa_{1-x}As$, where x is chosen so that the conduction band minimum energy for electrons in the injection layers is about that of, but less than, the resonance energy level of the quantum well; and a barrier layer between each of the electron injection layers and the quantum well, the barrier layers having a composition of $Al_yGa_{1-y}As$, where y is greater than x and y is chosen so that the conduction band minimum energy for electrons in the barrier layers is greater than the resonance energy level of the quantum well.

It will now be appreciated that the present invention provides an important advance in the field of double barrier tunnel diodes. By setting the conduction band minimum energy level of the injection layers to just below the resonance energy of the quantum well, the internal voltage required to satisfy the resonant tunneling condition and enter the negative resistance range is significantly reduced, yielding improvements to the operating characteristics. The external DC operating point voltage and applied exernal voltage are also reduced, resulting in improved power output and high frequency performance. Other features and advantages of the invention will be apparent from the following more detailed description, taken in conjunction with the accompanying drawings, which description illustrates, by way of example, the principles of the invention.

DETAILED DESCRIPTION OF THE PREFERRED EMBODIMENT

Figure 1:
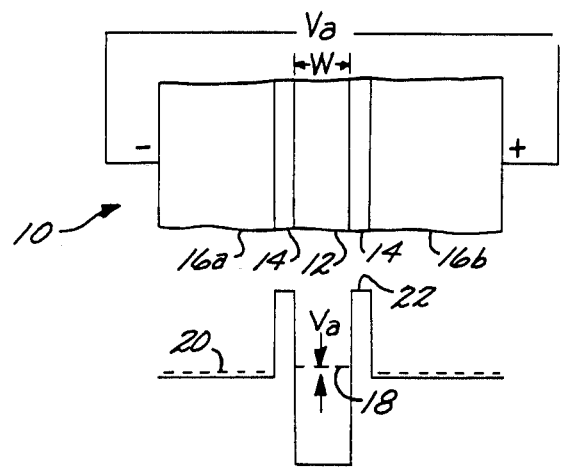
FIG. 1 is a schematic side sectional view of a double barrier tunnel diode in accordance with the invention.
Figure 2:
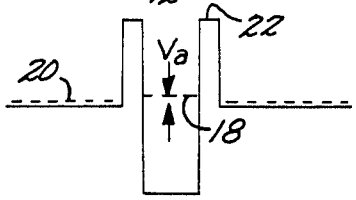
FIG. 2 is a graph of the energy states within the diode of FIG. 1, with no applied voltage.

The present invention is embodied in a double barrier tunnel diode 10, illustrated in FIGS. 1 and 2. Such a tunnel diode 10 includes a quantum well 12, bounded on each side by a barrier layer 14. The quantum well 12 and the two barrier layers 14 are together termed herein a quantum barrier 15. Disposed outwardly of the barrier layers 14, on either side of the quantum barrier 15, are a pair of injection layers 16. In operation, electrons are supplied from one of the injection layers, here illustrated as injection layer 16a. Under the proper conditions, to be discussed subsequently, electrons from the injection layer 16a resonantly tunnel through the quantum barrier 15 to the other injection layer 16b, thereby producing a current through the quantum barrier 15 and the diode 10.

In the preferred embodiment, the quantum well 12 is gallium arsenide, the barrier layers 14 are aluminum gallium arsenide of composition $Al_yGa_{1-y}As$, and the injection layers 16 are aluminum gallium arsenide of composition $Al_xGa_{1-x}As$. This structure may be prepared by epitaxial growth techniques such as molecular beam epitaxy and metal organic chemical vapor deposition. For example, a first injection layer is grown by epitaxially depositing aluminum gallium arsenide of a desired x value onto a substrate of single crystal gallium arsenide. A first barrier layer is epitaxially deposited overlying the first injection layer by growth of aluminum gallium arsenide of a desired y value. The quantum well of gallium arsenide is epitaxially deposited overlying the first barrier layer. A second barrier layer is epitaxially deposited overlying the quantum well by depositing aluminum gallium arsenide of the desired y value. A second injection layer is then epitaxially deposited overlying the second barrier layer by depositing aluminum gallium arsenide of the desired x value.

The thickness w of the quantum well is preferably less than 200 Angstroms. If a wider well is used, there is a greater probability of scattering of the tunneling electrons, reducing the transmission coefficient of the electrons and thence the maximum current attainable through the diode 10. The thickness of the barrier layers must be sufficiently small to permit tunneling of the electrons through the quantum barrier 15. Desirably, the barrier layers are less than about 40 Angstroms thick. Deposition apparatus is usually calibrated so that layers of the desired thicknesses can be reproducibly deposited. Finally, electrical contacts are deposited onto the injection layers as required. This description relates to the preparation of an isolated double barrier tunnel diode, but in many device applications the tunnel diode of the invention will be fabricated into a complex integrated circuit. Nevertheless, the principles of preparation remain unchanged.

Electrons within the quantum well 12 are restricted to energy levels, as indicated by the resonance energy 18, determined by the chemical composition of the quantum well 12, its lateral extent w, and the nature of the neighboring barriers 14. An electron injected from the injection layer 16 into the quantum barrier 15 under an internal voltage $V_a$ has a high transmission coefficient if its injected energy is very near to that of the resonance energy 18.

Electrons in the injection layers 16 reside at energies near, and slightly above, that of the conduction band minimum energy 20. The value of the conduction band minimum energy 20 is dependent upon the composition of the injection layer 16. In the double barrier tunnel diode 10 of the present invention, the composition of the injection layer 16 is selected to be such that the conduction band minimum energy 20 is about that of, but less than, the quantum well resonance energy 18. This near coincidence of the conduction band minimum energy 20 and the quantum well resonance energy 18 results in a high transmission coefficient for the electrons and a high tunneling current.

In a conventional double barrier tunnel diode, the injection layers are of substantially the same composition as the quantum well, with the result that the conduction band minimum energy of the injection layers is much lower than the resonance energy of the quantum well. The required voltage $V_a$ to meet the resonant tunneling condition is large, with the consequent deleterious effects discussed previously. Specifically, the energy bands of both the injection layers and the quantum well are badly tilted and skewed, reducing the transmission coefficient of the electrons and the tunneling current. In the present double barrier tunnel diode 10, the conduction band minimum energy 20 of the injection layer is raised to be near to that of the resonance energy 18 of the quantum well, so that $V_a$ is smaller than in the case of the conventional double barrier tunnel diode. The conduction band minimum energy 20 cannot be raised to a value equal to or greater than the resonance energy 18, since electrons would not then tunnel through the quantum barrier 15 and the desired negative resistance would not be observed.

It is therefore necessary that the conduction band minimum energy 20 of the injection layer 16 be "about that of, but less than" the resonance energy 18 of the quantum well 12. This terminology means that the conduction band minimum energy 20 cannot equal or exceed the resonance energy 18. The terminology also means that the conduction band minimum energy 20 should be as close to, but less than, the resonance energy 18 as possible, within the limits of fabrication technology. Most of the conduction electrons in the injection layer 16 reside between the conduction band minimum energy 20 and the Fermi level, and it is therefore preferred that the conduction band minimum energy 20 be less than the quantum well resonance energy 18 by about the difference between the Fermi level and the conduction band minimum energy 20. Alternatively stated, the Fermi level of the injection layer 16 is preferably at about the same energy as the resonance energy 18 of the quantum well 12. By selecting a composition for the injection layer that establishes the preferred conduction band minimum energy, the number of electrons available for tunneling is large, and the internal voltage necessary across the quantum barrier to induce tunneling is small. The terminology cannot be defined more particularly or limited to set values, since the effect of lowering the conduction band minimum energy is to increase the required $V_a$.

Figure 3:
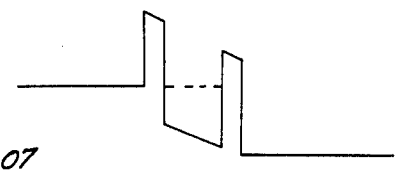
FIG. 3 is a graph of the energy states within the diode of FIG. 1, with an applied voltage.

The tilting of the energy bands illustrated in FIG. 3 is reduced as the value of the conduction band minimum energy 20 approaches that of the resonance energy 18, and the value of the internal voltage $V_a$ necessary to achieve resonant tunneling is reduced. The DC operating point voltage, the externally applied voltage necessary to bias the diode to the negative resistance range, is therefore also reduced. The reduction in DC operating point voltage is important, since it reduces the power consumption of the diode. Additionally, the necessary applied external voltage to achieve the necessary internal voltage $V_a$ for resonant tunneling can be expected to be reduced. The applied external voltage, which is that applied to the external contacts, must be distinguished from the internal voltage, which is that across the quantum barrier, since the presence of contact resistance and material resistance suggests that the external voltage will be different from the internal voltage in a way that cannot be predicted with certainty absent complete knowledge of all of the circuit parameters. Nevertheless, the general reduction in the necessary operating voltages is beneficial for the reasons already stated.

Figure 4:
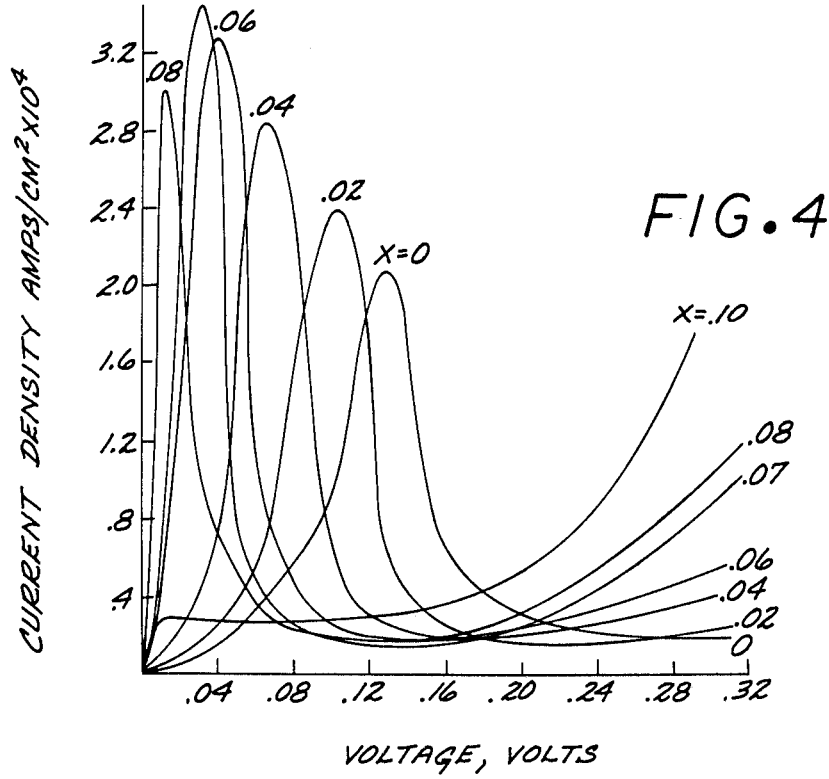
FIG. 4 is a calculated graph of current density as a function of applied voltage, for various compositions of the injection layer, for one version of the diode of FIG. 1.

In the preferred embodiment wherein the quantum well 12 is gallium arsenide, the composition of the injection layers 16 can be stated in terms of the aluminum content x, expressed in atom fraction (where 1.0 corresponds to 100 percent). FIG. 4 illustrates the calculated current density through the tunnel diode 10 as a function of $V_a$ for several different values of x, for a specific embodiment wherein the width w of the quantum well 10 is 51 Angstroms, the width of each of the barrier layers 14 is 23 Angstroms, and y is equal to 0.30 (in atom fraction). For a value of x equal to 0 (i.e., a gallium arsenide injection layer), the resonant voltage is about 0.13 volts and the maximum current density is about $2.0 \times 10^4$ amps per square centimeter. As x is increased to about 0.07, the value of the required internal voltage to satisfy resonance is reduced to about 0.03 volts, and the maximum current density at resonance increases to about $3.4 \times 10^4$ amps per square centimeter. Thus, less internal voltage $V_a$ is required to satisfy the resonance condition, a higher ratio of peak-to-valley current is achieved, a lower DC operating point external bias voltage is required to reach the negative resistance range, and power consumption of the diode is reduced. There is a maximum beneficial effect at a value of x of about 0.07. For x of 0.08, the applied voltage to satisfy the resonance condition is reduced somewhat, but the maximum current density and peak-to-valley ratio also fall. For x of 0.10, the conduction band minimum 20 of the injection layer apparently exceeds the resonance energy 18, and there is no negative resistance region.

The value of the resonance energy 18 varies with the nature of the materials from which the tunnel diode 10 is made, the width of the quantum well 12, the height and width of the barrier layers 14, and possibly other factors. It is therefore not possible to state a particular numerical value for x that provides optimum performance in all cases for the improved double barrier tunnel diode 10. Instead, the optimum value can be calculated by mathematical models known in the art, such as the two band tight binding model.

The value of y, the composition of the barrier layers 14, must be such that a conduction band minimum energy 22 of the barrier layers 14 is greater than the resonance energy of the quantum well 12. This high conduction band minimum energy effectively creates the resonance of electrons within the quantum well 12, thereby permitting operation of the double barrier tunnel diode 10.

In the preferred gallium arsenide embodiment of the diode 10, the value of x can range from about 0.01 to about 0.3, and the value of y can range from about 0.2 to about 1.0.

The present invention, while applied to a two-terminal diode in the preferred embodiment, is also not inconsistent with the addition of a third terminal, as, for example, a provision for applying a voltage to the quantum barrier. The reduction of applied internal voltage achieved with the invention has equal applicability to such three-terminal devices, and may be a primary factor in making such devices feasible. A device incorporating the features of the present invention and having a third terminal added is intended to be within the scope of the term diode as used herein in conjunction with the present invention, inasmuch as such a three-terminal device can be viewed as a diode with an added voltage input.

The double barrier tunnel diode of the present invention overcomes important deficiencies of prior double barrier tunnel diodes by reducing the required internal voltage $V_a$ for satisfaction of the resonance condition. As a result, the current that the diode transmits is increased, the peak-to-valley current ratio is increased, and the DC operating voltage of the diode is reduced. Although a particular embodiment of the invention has been described in detail for purposes of illustration, various modifications may be made without departing from the spirit and scope of the invention. Accordingly, the invention is not to be limited except as by the appended claims.

What is claimed is:

1. A double barrier tunnel diode, comprising:
   a quantum well region having at least one layer of gallium arsenide semiconductor material, said quantum well region having a resonance energy level for electrons;
   a pair of electron injection layers made of aluminum gallium arsenide on either side of said quantum well region, said electron injection layers having an aluminum content such that the conduction band minimum energy for electrons in said injection layers is about that of, but less than, the resonance energy level of said quantum well region; and
   a barrier layer between each of said electron injection layers and said quantum well region, said barrier layers made of aluminum gallium arsenide having an aluminum content greater than that of said injection layers such that the conduction band minimum energy for electrons in said barrier layers is greater than the resonance energy of said quantum well region, and having a thickness sufficiently small to permit electrons to tunnel through said barrier layers to said quantum well region.

2. The tunnel diode of claim 1, wherein said quantum well region is less than about 200 Å thick.

3. The tunnel diode of claim 2, wherein said barrier layers are each less than about 40 Å thick.

4. The tunnel diode of claim 3, wherein the atomic ratio of aluminum content to gallium content in said injection layers is from about 1:99 to about 30:70.

5. The tunnel diode of claim 3, wherein the atomic ratio of aluminum content to gallium content in said barrier layers is from about 20:80 to about 100:0.

6. The tunnel diode of claim 1, wherein the fermi energy of the electrons in said injection layer is about equal to the resonance energy of said quantum well region.

7. A double barrier tunnel diode, comprising:
   a gallium arsenside quantum well region having a resonce energy for electrons;
   a pair of aluminum gallium arsenide injection layers on either side of said quantum well each of said injection layers having a composition of $Al_xGa_{1-x}As$, where x is chosen so that the conduction band minimum energy for electrons in said injection layers is about that of, but less than, the resonance energy of said quantum well region; and
   a barrier layer between each of said electron injection layers and siad quantum well region, said barrier layers having a composition of $Al_yGa_{1-y}As$, where y is greater than x, and y is chosen so that the conduction band minimum energy for electrons in said barrier layers is greater than the resonance energy of said quantum well region.

8. The tunnel diode of claim 7, wherein x is from about 0.01 to about 0.3.

9. The tunnel diode of claim 7, wherein y is from about 0.2 to about 1.0.

10. The tunnel diode of claim 7, wherein said quantum well regionis less than about 200 Å thick.

11. The tunnel diode of claim 7, wherein the fermi energy of the electrons in said injection layer is about equal to the resonance energy of said quatnum well region.

* * * * *